US006844491B1

(12) United States Patent
Malmberg

(10) Patent No.: US 6,844,491 B1
(45) Date of Patent: Jan. 18, 2005

(54) GROUNDING ASSEMBLY WITH SELF-ALIGNING FINGERS

(75) Inventor: Jon C. Malmberg, Portland, OR (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 10/753,578

(22) Filed: Jan. 8, 2004

(51) Int. Cl.[7] .................................................. H05K 9/00
(52) U.S. Cl. ........................ 174/35 R; 174/51; 361/753; 361/816; 361/818
(58) Field of Search ................................ 174/35 R, 36, 174/35 GC, 35 MS, 51; 361/753, 799, 800, 816, 818

(56) References Cited

U.S. PATENT DOCUMENTS

| | | | | |
|---|---|---|---|---|
| 5,043,528 A | * | 8/1991 | Mohr | 174/35 GC |
| 5,134,252 A | * | 7/1992 | Himeno et al. | 174/36 |
| 6,097,906 A | * | 8/2000 | Matsuzaki et al. | 399/90 |
| 6,283,770 B1 | * | 9/2001 | Leung et al. | 361/818 |
| 6,320,120 B1 | * | 11/2001 | Van Haaster | 174/35 R |
| 6,346,672 B1 | * | 2/2002 | Horng | 174/35 R |
| 6,355,878 B1 | * | 3/2002 | Kim | 174/35 R |
| 6,487,058 B1 | * | 11/2002 | Dykes | 361/56 |

* cited by examiner

*Primary Examiner*—Dean A. Reichard
*Assistant Examiner*—Adolfo Nino
(74) *Attorney, Agent, or Firm*—Fay, Sharpe, Fagan, Minnich & McKee, LLP

(57) ABSTRACT

A grounding assembly includes a shaft bearing connected to an associated shaft. The bearing includes a cylindrical portion and an annular head portion. A structure having a first surface with an aperture defined therein receives the cylindrical portion of the shaft bearing. The annular head portion of the bearing has a shoulder for seating against the first surface of the structure. A grounding member includes an annular portion positioned between the first surface of the structure and the annular head portion of the shaft bearing. The grounding member further includes fingers positioned between the cylindrical portion of the shaft bearing and an inner cylindrical surface of the structure that defines a length of the aperture. At least one of the fingers includes (1) a first bend for allowing the at least one of the fingers to enter the aperture and (2) a second bend for allowing the at least one of the fingers to contact the cylindrical portion of the shaft bearing.

21 Claims, 9 Drawing Sheets

GROUNDING ASSEMBLY WITH SELF-ALIGNING FINGERS

BACKGROUND

The present application relates to a grounding assembly for use in an electronic device that includes a shaft rotatably mounted in an insulated environment. More particularly, the present invention relates to a grounding assembly for use with a rotatable shaft in a printer assembly and will be described with particular reference thereto. However, it is to be appreciated that the grounding assembly may be used in other similar environments and applications.

Many electronic devices, including many printer devices, include one or more shafts rotatably mounted to an insulated frame structure. Bearings are often employed to rotatably support and connect such a shaft to the frame structure. One problem frequently encountered in these types of arrangements is the build-up of an electrical charge in the shaft. For example, in a printer device shafts are used that engage or have components therein that engage moving objects. One specific example is an exit shaft on a printer device. An exit shaft is involved with moving paper out of the printer device and, in this capacity, often picks up a charge. Particularly, when such shafts are metallic and the structure supporting the shaft is insulated or non-conductive, the charge can build-up to undesirable levels over time.

When a charge builds up in a shaft, or in the bearing or bearings supporting the shaft, but is not dissipitated because the structure the shaft is mounted to is insulated, the possibility of an undesirable electrical static discharge (ESD) is increased. If an ESD occurs, a user of the printer device can be shocked and/or one of the electrical components of the printer device could become damaged and/or unusable. Grounding assemblies are known to be used with shafts and bearings for reducing the likelihood of an ESD. Such grounding assemblies are in electrical contact with at least one of the shaft and its bearings and are suitably electrically connected to dissipitate any significant charge occurring in the shaft or its bearings.

Some prior art grounding assemblies incorporate fingers for better grounding the electrically conductive shaft and its bearings. These fingers often extend axially between the shaft bearings and the insulated structure receiving the bearings. Fingers of many prior art grounding assemblies were often replete with deficiencies. For example, the fingers sometimes included an angle to bend the finger into contact with the bearing. These bends were often sharp which resulted in excess deformation of the finger and poor structural contact between the finger and the bearing. More specifically, excess deformation reduced any spring force in the fingers resulting in poor contact. When multiple fingers are used, they are known to sometimes deform in different amounts relative to one another resulting in varying qualities of contact and preventing the bearing from properly centering within a designated hole in the surrounding structure. Thus, there is a need for a grounding structure that maintains acceptable electrical contact and/or assists in centering a shaft bearing within a designated hole.

Moreover, some prior art grounding assemblies have configurations that made assembly of the shaft, bearings and grounding assemblies into an electric device difficult. More specifically, some previous grounding finger geometries do not allow the bearing to begin to be seated in an aperture of the surrounding structure before it made contact with and began to yield the grounding part. As a result, it is often difficult to easily and efficiently install bearings into frame structure apertures when grounding assemblies are employed.

BRIEF SUMMARY

A grounding assembly includes a shaft bearing connected to an associated shaft. The bearing includes a cylindrical portion and an annular head portion. A structure having a first surface with an aperture defined therein receives the cylindrical portion of the shaft bearing. The annular head portion of the bearing has a shoulder for seating against the first surface of the structure. A grounding member includes an annular portion positioned between the first surface of the structure and the annular head portion of the shaft bearing. The grounding member further includes fingers positioned between the cylindrical portion of the shaft bearing and an inner cylindrical surface of the structure that defines a length of the aperture. At least one of the fingers includes (1) a first bend for allowing the at least one of the fingers to enter the aperture and (2) a second bend for allowing the at least one of the fingers to contact the cylindrical portion of the shaft bearing.

DETAILED DESCRIPTION

Figure 1:
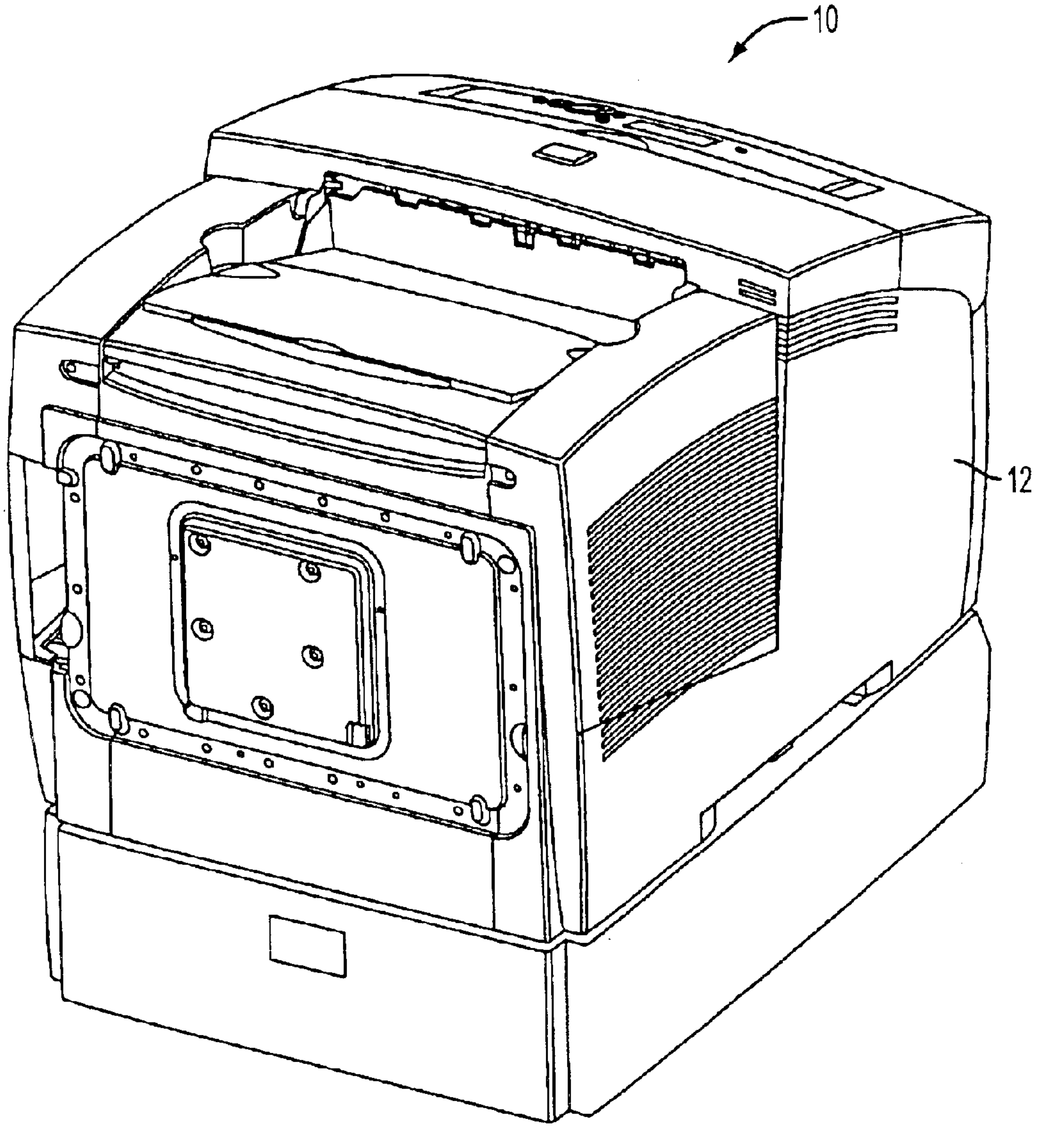
FIG. 1 is a perspective view of a printer device employing a grounded bearing assembly therein.
Figure 2:
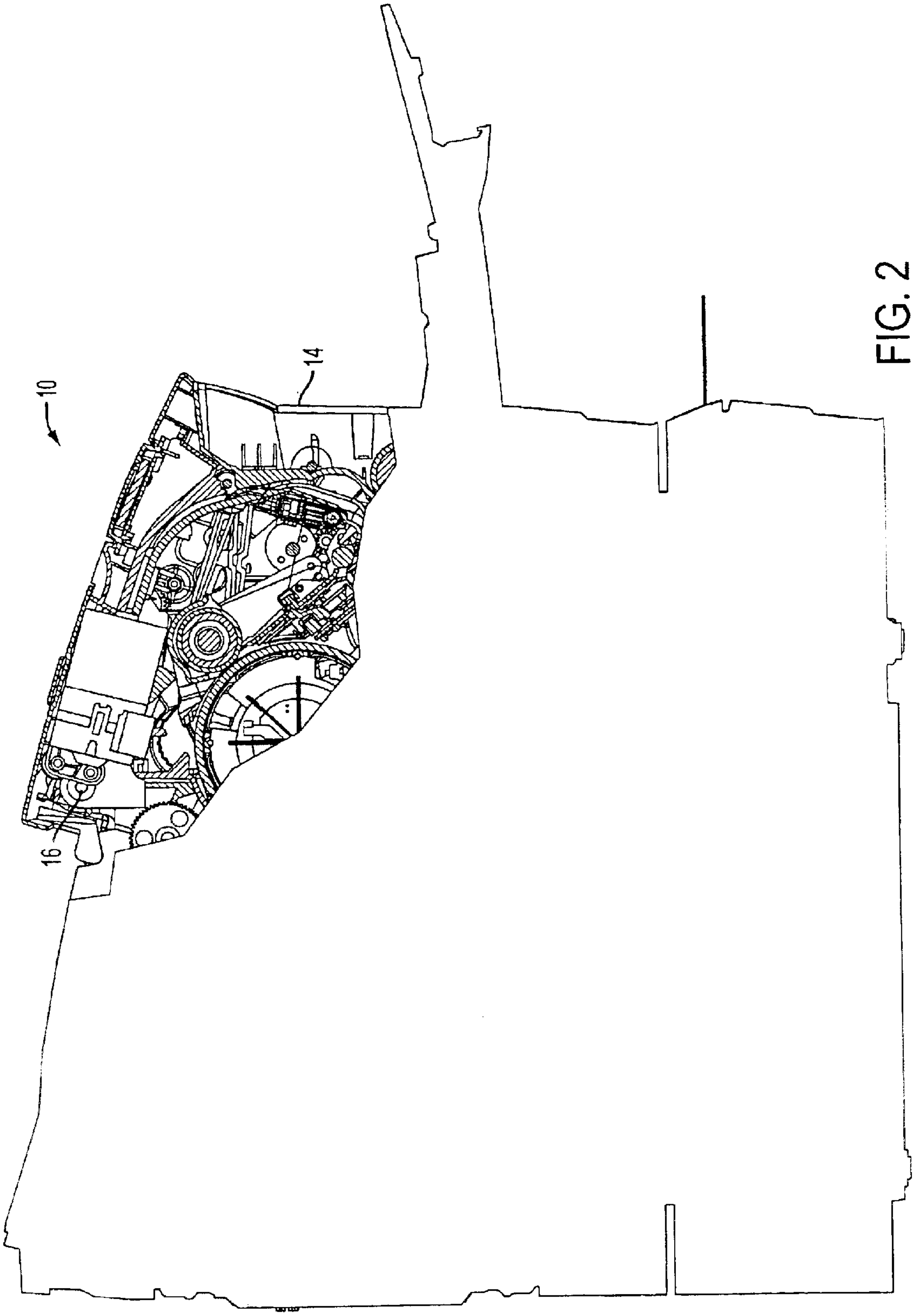
FIG. 2 is a side elevational view of the printer device of FIG. 1 shown with a cover removed to reveal an exit shaft rotatably mounted in the printer device.

Referring now to the drawings wherein the showings are for purposes of illustrating one embodiment and not for purposes of limiting the same, with reference to FIG. 1, a device, such as printer device 10, includes one or more covers 12 mounted to a frame structure 14 (FIG. 2). The printer device 10 can include components found in conventional printer devices such as print drums, print heads, maintenance rollers, transfix rollers and the like. Beneath the one or more covers 12, with additional reference to FIG. 2, the printer device 10 includes one or more shafts, such as exit shaft 16, that are capable of picking up electrical charges and, therefore, are preferably grounded. More specifically, the exit shaft 16 is a metallic shaft directly associated with moving print media, such as paper, out of the printer device 10 after printing. As a result, the exit shaft 16 is relatively more subject to absorbing static electricity or a charge which may come from the print media itself or other components positioned adjacent thereto. Shafts constructed of conductive material, which can include the exit shaft 16, are particularly susceptible to picking up electrical charges.

Figure 3:
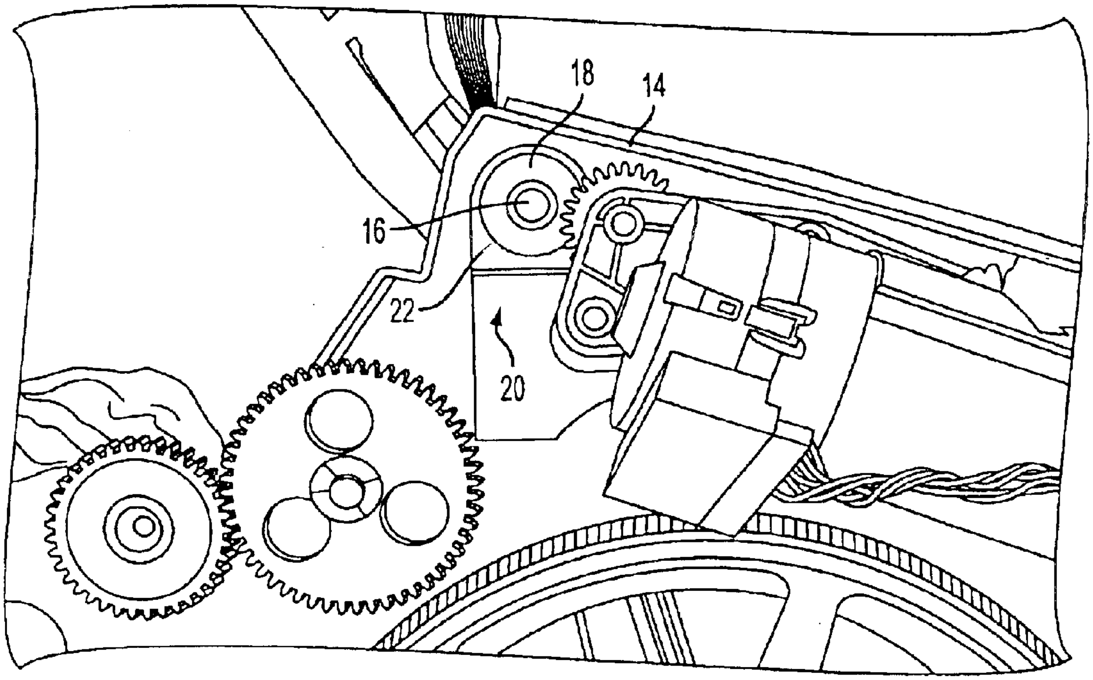
FIG. 3 is an enlarged partial view of the printer device of FIG. 2 shown with a fan removed to reveal a grounding assembly including the exit shaft, a bushing supporting the exit shaft and a grounding member electrically grounding the bushing.

With additional reference to FIG. 3, the exit shaft 16 of the printer device 10 is rotatably mounted to the frame 14 by a pair of bearings 18 (only one shown in FIG. 3) that can also be made of a conductive material, such as brass or copper. Like the shaft 16, metallic bearings are also particularly susceptible to picking up electrical charges. The frame structure 14 in which the bearings 18 are received to rotatably mount the shaft 16 may be constructed of an insulated or relatively nonconductive material, such as plastic, which further enhances the likelihood of an electrical charge building in the shaft 16 or its bearings 18 because any electricity absorbed thereby could not pass through the nonconductive frame structure 14.

If a charge were allowed to build in the shaft 16 and/or the bearings 18, the possibility would exist for an electrical static discharge (ESD) which has the potential to severely damage electrical components of the printer device, especially those located near the shaft 16. There may also exist the possibility of an ESD that would shock a user of the printer device 10. One way to prevent or reduce the likelihood of an ESD occurring in the printer device 10 is to bleed off any charge from the bearings 18 and the shaft 16, as well as any other similarly susceptible shafts and bearings in the printer device 10, and direct such electricity to a remote area of the printer device 10 or to a remote area outside the printer device 10. One way to bleed off the bearings and shafts of printer devices, as well as those of other electrical devices, is to ground at least one of the bearings and the shafts.

Figure 10:
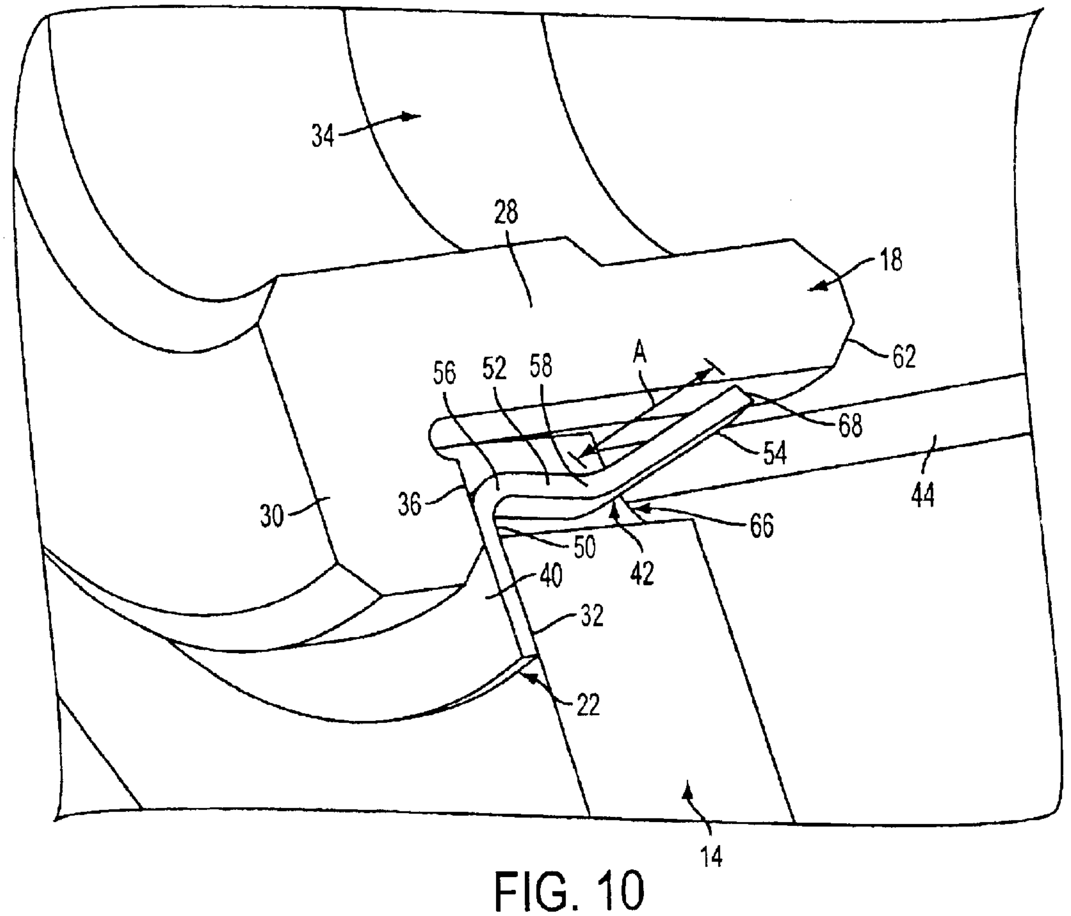
FIG. 10 is an enlarged partial perspective cross-sectional view of the grounding assembly of FIG. 3 showing the bearing fully inserted in the aperture of the frame structure to a position wherein the bearing deforms the fingers of the grounding member.

For purposes of grounding, the printer device 10 includes a printer grounding assembly 20 that absorbs electrical charges and directs them to desired remote areas. As will be understood by those skilled in the art, the grounding assembly 20 is only described in the context of a printer device but could be readily adapted for use in any device where grounding of electrical charges is a concern in relation to a rotatably mounted shaft. Additionally, the grounding assembly 20 could be modified or adapted for use on other shafts of the printer device 10 including, without limitation, the duplex shaft. According to one embodiment, the grounding assembly 20 includes the bearing 18 (also referred to herein as shaft bearings), the frame structure 14 in which the bearing is received, and a grounding part or member 22. As already mentioned, the bearing 18 is connected to the shaft 16 and rotatably mounts the shaft 16 to the frame structure 14. With reference to FIG. 10, the bearing 18 includes a cylindrical portion 28 and an annular head portion 30.

The frame structure 14 has at least a first surface 32 that defines an aperture 34 therein. The cylindrical portion 28 of the bearing 18 is received in the aperture 34. The annular head portion 30 of the bearing 18 extends radially beyond the cylindrical portion 28 and defines an annular shoulder 36. The shoulder 36 seats against, although does not necessarily abut or directly contact, the first surface 32 of the frame structure 14. As will be described in more detail below, the grounding member 22 includes an annular plate portion 40 having one or more fingers 42 depending therefrom. The annular portion 40 is positioned between the first surface 32 of the structure 14 and the annular head portion 30 of the bearing 18. Thus, the shoulder 36 of the bearing 18 seats directly against the annular portion 40 which, in turn, rests against the first surface 32.

Figure 4:
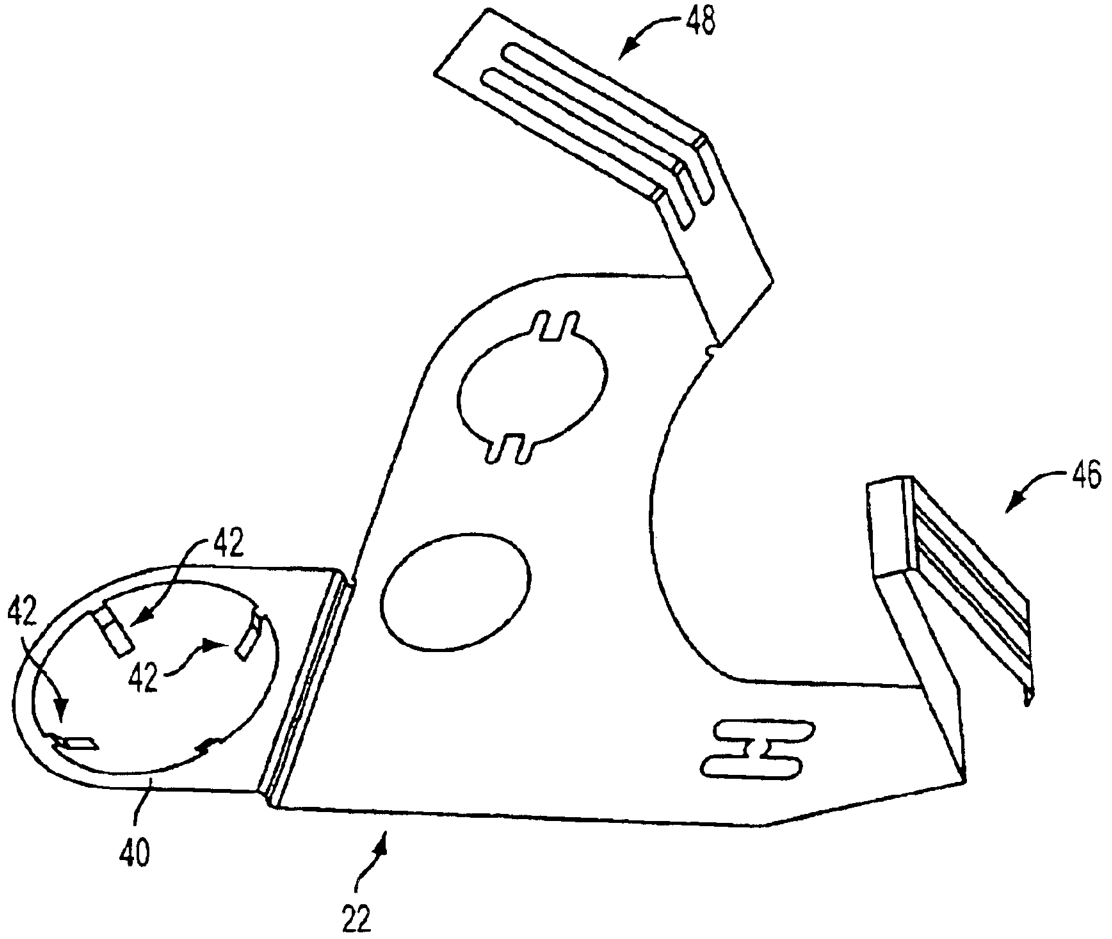
FIG. 4 is a perspective view of the grounding member of FIG. 3.
Figure 5:
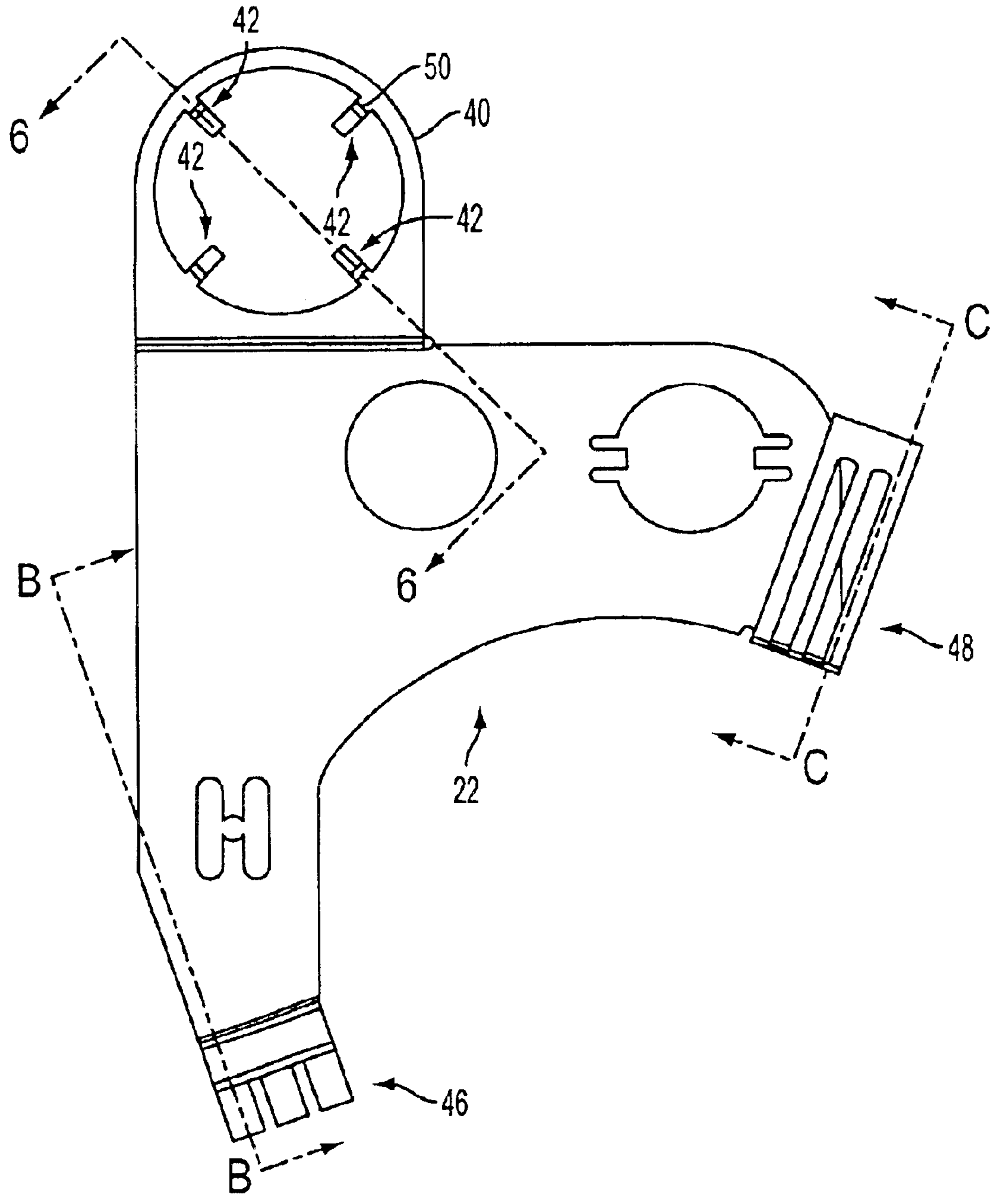
FIG. 5 is a plan view of the grounding member of FIG. 3.

The one or more fingers 42 are positioned between the cylindrical portion 28 of the bearing 18 and an inner cylindrical surface 44, also refereed to herein as an inner wall, of the structure 14 that defines a length of the aperture 34. Thus, the one or more fingers 42 are axially positioned between the cylindrical portion 28 and the surface 44. With additional reference to FIGS. 4 and 5, in one embodiment, the grounding member 22 includes four (4) fingers 42 equidistantly spaced about the annular portion 40. Thus, the fingers 42 are equally spaced radially about the annular portion 40 such that two sets of fingers are provided and each set has two fingers opposed to one another. Of course, other numbers of fingers can be used and should be considered within the scope of the present invention.

The grounding member or plate 22 is made of an electrically conductive material, such as stainless steel with a nickel coating in one embodiment, and, in one embodiment, includes two sets of leads 46 and 48 spaced from the annular portion 40. One of the sets of leads 46 can be connected to another component in the printer device 10, such as an electric motor for example, for purposes of grounding that component and the other of the sets of leads 48 can be connected to electrical communicating means, such as wires, a conductive component or the like, for directing and transmitting any charges absorbed from the bearing 18 and/or the shaft 16 to a desired remote area. Of course, other plate configurations are possible and the plate need not be connected to any other components for purposes of grounding those components or may be connected to multiple components for purposes of grounding those components.

Figure 6:
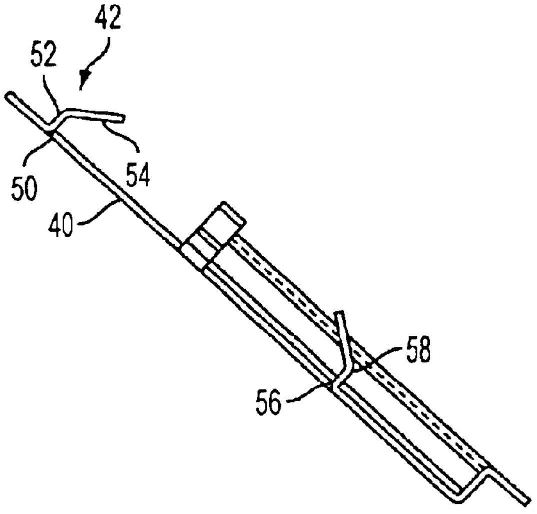
FIG. 6 is a cross-sectional view of the grounding member taken along the line 6—6 of FIG. 5.
Figure 7:
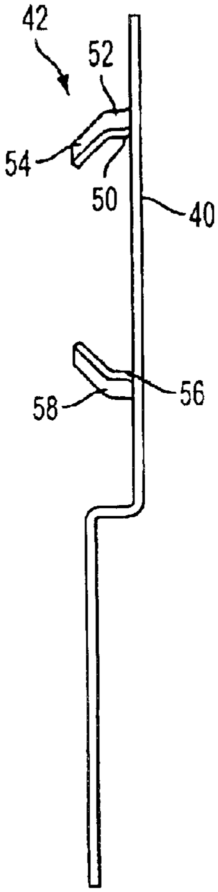
FIG. 7 is a side elevational view of the grounding member of FIG. 3.

With reference to FIGS. 6 and 7, each finger 42 includes an arm portion 50 (see FIG. 10) generally parallel to the annular portion 40 (which is generally parallel with the first surface 32 of the frame structure when the grounding member 22 and bearing 18 are assembled) and radially extending from the annular portion 40 toward the cylindrical portion 28 of the bearing 18. Each finger 42 further includes a first portion 52 oriented approximately normal to the arm portion 50 and a second portion 54 angularly oriented relative to the first portion 52 and spaced distally relative to the first portion 52. Each finger 42 further includes a first bend 56 between the arm portion 50 and the first portion 52 that allows the finger to enter the aperture 34 of the frame structure 14 and a second bend 58 between the first portion 52 and the second portion 54 that allows the finger to contact the cylindrical portion 28 of the bearing 18. Thus, each finger 42 includes two bends 56,58.

With additional reference to FIG. 10, the first portion 52 of each finger 42 extends generally axially into the aperture 34 between the cylindrical portion 28 and the surface 44 defining the aperture 34. The second portion 54 extends from the second bend 58 generally axially further into the aperture 34 between the cylindrical portion 28 and the surface 44 and also extends radially toward and into the cylindrical portion 28. In one embodiment, the first bend 56 can be oriented approximately normal or at about ninety degrees relative to the arm portion 50 and can include a radius of about 3 mm.

Figure 9:
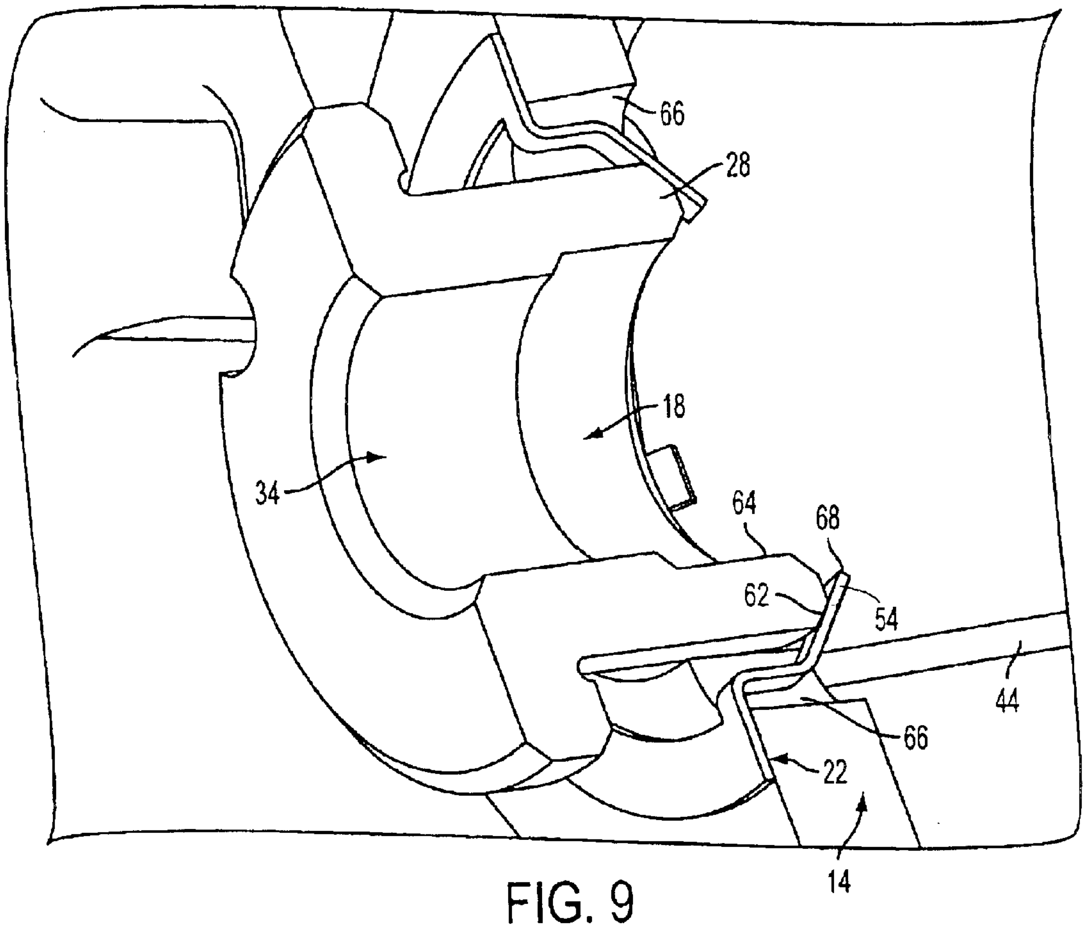
FIG. 9 is an enlarged partial perspective cross-sectional view of the grounding assembly of FIG. 3 showing the bearing partially inserted in the aperture of the frame structure to a position wherein the bearing initially contacts fingers of the grounding member.

With reference to FIG. 9, the cylindrical portion 28 of the bearing 18 includes a chamfer 62 at a distal end 64 thereof.

The chamfer 62 is oriented at an angle relative to an axis of the aperture 34 and/or the shaft 16 received in the aperture 34 such that the angle of the chamfer substantially matches an angle of the second portion 54 relative to the axis of the aperture 34 and/or the shaft 16 before the bearing 18 is fully inserted in the aperture 34. Thus, the chamfer 62 is approximately parallel to the second portion 54 when the distal end 64 of the bearing 18 initially contacts the finger 42 upon insertion of the bearing 18 into the aperture 34 for seating against the structure 14. The chamfer 62 functions to engage the fingers 42 and, more particularly, the second portions 54 and direct them radially outwardly. In one embodiment, the second portion 54 extends radially at an angle of about one-hundred and twenty-five degrees relative to the first portion 56 and the first portion 52 is approximately parallel to the axis of the aperture 34 and/or the shaft 16, the interior surface 44 defining the aperture and the bearing cylindrical portion 28.

With reference back to FIG. 10, with the bearing 18 fully inserted into the aperture 34, the cylindrical portion 28 bends or deforms the second portion 54. The configuration of the second portion 54 is such that it only elastically deforms when the cylindrical portion 28 bends it upon insertion of the bearing 18. Thus, the angle of the second portion 54 and a longitudinal length A of the second portion 54 are together sufficient, in combination with the second portion's distance relative to the axis of the aperture and/or shaft, such that the second portion stays within an elastic deformation range when the second portion 54 is engaged and deformed by the cylindrical portion 28 of the bearing 18.

With continued reference to FIG. 10, the inner cylindrical surface 44 of the structure 14 includes radial recesses 66 appropriately spaced for receiving the fingers 42. More particularly, first portions 52 of the fingers 42 are received in the radial recesses 66 removing the first portions 52 from obstructing the cylindrical portion 28 of the bearing 18. Thus, the cylindrical portion of the bearing 18 is prevented from contacting the first portions 52 of the fingers 42. As already described, the second portions 54 extend both axially and radially from the first portions 52 and contact the cylindrical portion 28 of the bearing 18. The distal ends 68 of each of the fingers 42 are sufficiently sharp for scratching into an outer surface 70 of the cylindrical portion 28 of the bearing 18.

Figure 8:
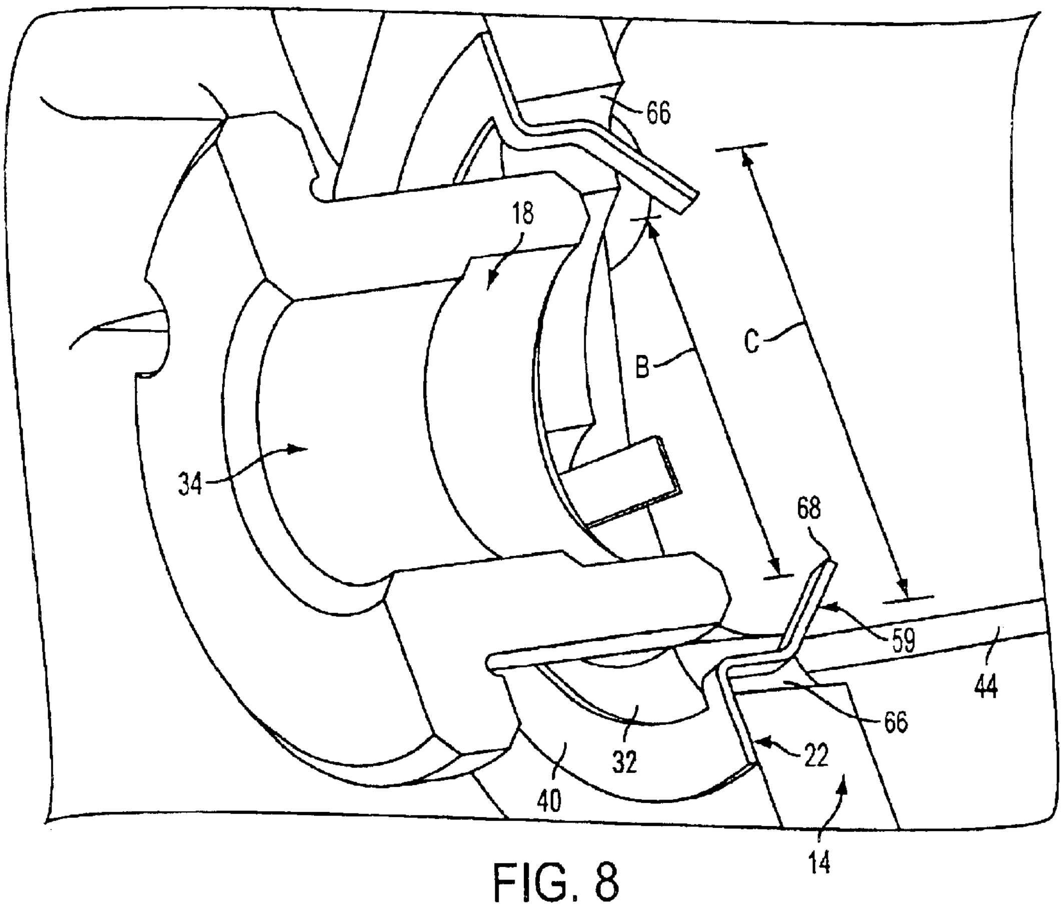
FIG. 8 is an enlarged partial perspective cross-sectional view of the grounding assembly of FIG. 3 showing a bearing slightly inserted in an aperture of a frame structure.

To assemble the grounding assembly 20, with reference to FIG. 8, the annular portion 40 of the grounding member 22 is placed around the aperture 34 and the fingers are inserted into the aperture 34. More particularly, the fingers 42 are inserted into respective recesses 66 to radially align the grounding member 22 in the aperture 34 and the annular portion 40 is positioned against the first surface 32. As described above, the first portions 52 of the fingers 42 extend axially and are approximately parallel to the interior surface 44. The second portions 54 extend radially inwardly and opposed fingers are spaced a distance B relative to one another.

Next, with additional reference to FIG. 9, the bearing 18 is aligned with the aperture 34, i.e., a centerline axis of the bearing 18 is aligned with a centerline axis of the aperture 34, and the cylindrical portion 28 is partially inserted into the aperture 34. The surface 44 guides the cylindrical portion 28 into the aperture 34 of the structure 14 and the recesses 66 permit the bearing 18 to be partially seated prior to engaging the fingers 42. Partial seating of the bearing 18 prior to engagement with the fingers enables relatively easier assembly of the bearings 18 in the structure 14 because there is no resistance to such partial seating.

Then, with additional reference to FIG. 10, the bearing 18 can be further inserted into the aperture 34 until the shoulder 36 seats against the annular portion 40 and the first surface 32. With this further insertion, the chamfer 62 of the bearing 18 engages the second portions 54 and expands the fingers radially outwardly. The chamfer 62 mating with the second portions 54 centers the bearing 18 within the aperture 34 which ensures that all the fingers 42 are deformed equally. More particularly, the outer diameter C of the cylindrical portion of the bearing 18 is greater than a distance B between each of the two sets of fingers 42. When the cylindrical portion 28 contacts the fingers 42, each of the fingers contacts and remains in contact with the bearing 18 in a single location for improved electrical grounding. As discussed above, the fingers 42 deform, but only elastically, which ensures better contact between the fingers 42 and the bearing because the plastic deformation (as compared to yielding) of the fingers 42 urges the fingers back to their original position prior to deformation. Moreover, the fingers 42 maintain the position of the bearing 18 in the aperture 34.

Once assembled, any turning of the shaft 14 also turns the bearing 18 relative to the fingers 42. The spring force of the fingers 42 continues to urge the fingers into the bearing 18 and are assisted by the relatively sharp distal ends 68 of the fingers and, when the shaft is rotated, the fingers gouge the bearing 18 which further improves electrical contact. Thus, the grounding assembly 20 increases the ease at which the grounded bearing 18 is installed into the aperture 34 of the frame structure 14 and maintains better electrical contact once installed.

The exemplary embodiment has been described with reference to the embodiments. Obviously, modifications and alterations will occur to others upon reading and understanding the preceding detailed description. It is intended that the exemplary embodiment be construed as including all such modifications and alterations insofar as they come within the scope of the appended claims or the equivalents thereof.

What is claimed is:

1. A grounding assembly, comprising:

a shaft bearing connected to an associated shaft, said bearing including a cylindrical portion and an annular head portion;

a structure having a first surface with an aperture defined therein receives said cylindrical portion of said shaft bearing, said annular head portion of said bearing having a shoulder for seating against said first surface of said structure; and a grounding member including:

an annular portion positioned between said first surface of said structure and said annular head portion of said shaft bearing, and fingers positioned between said cylindrical portion of said shaft bearing and an inner cylindrical surface of said structure that defines a length of said aperture, at least one of said fingers includes (1) a first bend for allowing said at least one of said fingers to enter said aperture and (2) a second bend for allowing said at least one of said fingers to contact said cylindrical portion of said shaft bearing.

2. The grounded bearing assembly of claim 1 wherein said at least one of said fingers includes (1) a first portion between said first bend and said second bend extending generally axially into said aperture and (2) a second portion extending from said second bend extending generally axially further into said aperture and radially into said cylindrical portion of said bearing.

3. The grounded bearing assembly of claim 2 wherein said at least one of said fingers further includes an arm portion radially extending from said annular portion toward said cylindrical portion of said bearing and to said first bend.

4. The grounded bearing assembly of claim 2 wherein at least one of (1) said second portion has a longitudinal length sufficient to stay within an elastic deformation range when said second portion is engaged and deformed by said cylindrical portion of said shaft bearing and (2) said second bend positions said second portion at an angle that stays within said elastic deformation range when said second portion is engaged and deformed by said cylindrical portion of said shaft bearing.

5. The grounded bearing assembly of claim 2 wherein said cylindrical portion of said shaft bearing includes a chamfer at a distal end thereof that is approximately parallel to said second portion when said shaft bearing initially contacts said at least one of said fingers.

6. The grounded bearing assembly of claim 2 wherein said inner cylindrical surface of said structure includes recesses and at least one of said recesses receives said first portion of said at least one of said fingers so that said cylindrical portion of said shaft bearing is prevented from contacting said first portion.

7. The grounded bearing assembly of claim 1 wherein said second portion extends radially at an angle of about one-hundred and twenty-five degrees relative to said first portion.

8. The grounded bearing assembly of claim 1 wherein said cylindrical portion of said shaft bearing includes a chamfer at a distal end thereof for engaging said at least one of said fingers and directing said at least one of said fingers radially outwardly.

9. The grounded bearing assembly of claim 1 wherein said first bend is about ninety degrees and includes a radius of about 3 mm.

10. The grounded bearing assembly of claim 1 wherein said grounding member includes at least three fingers equally spaced apart on said annular portion and ends of said at least three fingers are sufficiently sharp for scratching the surface of the cylindrical portion of the bearing.

11. The grounded bearing assembly of claim 1 wherein said grounding member includes at least one set of opposed fingers and an outer diameter of said cylindrical portion of said shaft bearing is greater than a distance between said set of opposed fingers.

12. The grounded bearing assembly of claim 1 wherein recesses are defined in said inner cylindrical surface of said structure and receive said at least one of said fingers for allowing said cylindrical portion of said shaft bearing to be seated within said aperture prior to contact with said at least one of said fingers.

13. The grounded bearing assembly of claim 1 wherein said at least one of said fingers contacts said shaft bearing at a single location to improve grounding of said shaft bearing through said at least one of said fingers.

14. A printer grounding assembly for grounding a shaft of a printer, comprising:

a shaft;

a printer frame structure having an inner wall defining an opening, said inner wall including at least one recess adjacent one end of said opening;

a bushing having a cylindrical portion received in the opening for rotatably connecting the shaft to the frame structure;

a grounding part adapted to direct electrical charges away from said shaft and said bushing, said grounding part including at least one finger having (1) a first portion adjacent said one end of said opening that extends axially into said opening through said recess and (2) a second portion spaced apart from said one end of said opening that extends further axially into said opening and radially into contact with said bushing.

15. The printer grounding assembly of claim 14 wherein said at least one finger is only deformed elastically by said contact with said bushing and maintains electrical contact with said bushing.

16. The printer grounding assembly of claim 14 wherein said contact of said at least one finger with said bushing occurs adjacent an end of said bushing spaced apart from said one end of said opening to prevent an electrical charge from building in said bearing.

17. The printer grounding assembly of claim 14 wherein said grounding part includes a plate portion between a head of said bushing and said printer frame structure adjacent said one end of said opening and said at least one finger extends into said opening from said plate portion.

18. The printer grounding assembly of claim 17 wherein at least one of said plate portion and said at least one finger are stainless steel with a nickel coating.

19. The printer grounding assembly of claim 17 wherein said plate portion is electrically connected to a ground and is optionally connected to other components of a printer for purposes of grounding said other components.

20. A grounding assembly for grounding an insulated bearing on an associated shaft, comprising:

a structure having a first surface with an aperture defined therein and a second cylindrical surface defining a length of said aperture and having at least one recess defined therein;

a bearing including a cylindrical portion having an outer diameter smaller than an aperture inner diameter and an annular head portion having an outer diameter greater than said aperture inner diameter, the bearing adapted to rotatably connect an associated shaft to said structure when the cylindrical portion is received in said aperture;

a grounding member for directing electrical charges from said bearing, said grounding member including (1) an annular portion having an outer diameter larger than said aperture inner diameter and an inner diameter larger than said cylindrical portion outer diameter and (2) at least one finger extending from said annular portion, said at least one finger including a first portion extending axially from said annular portion and a second portion extending axially and radially inwardly from a distal end of said first portion.

21. The grounding assembly of claim 20 wherein said grounding member includes at least two opposed fingers having second portions that extend axially and radially inwardly and a distance between said at lest two opposed fingers is smaller than said cylinderical portion outer diameter.

* * * * *